United States Patent
Jensen et al.

(10) Patent No.: US 7,548,180 B2
(45) Date of Patent: *Jun. 16, 2009

(54) METHOD AND SYSTEM FOR DIGITAL TO ANALOG CONVERSION FOR POWER AMPLIFIER DRIVER AMPLITUDE MODULATION

(75) Inventors: Henrik Jensen, Long Beach, CA (US); Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/039,993

(22) Filed: Feb. 29, 2008

(65) Prior Publication Data

US 2008/0175333 A1    Jul. 24, 2008

Related U.S. Application Data

(63) Continuation of application No. 11/436,348, filed on May 18, 2006, now Pat. No. 7,362,251.

(51) Int. Cl.
    *H03M 3/00* (2006.01)
(52) U.S. Cl. ..................... 341/143; 341/144
(58) Field of Classification Search ................. 341/143, 341/144, 152, 118
    See application file for complete search history.

(56) References Cited

U.S. PATENT DOCUMENTS 5,245,345 A     9/1993  Kohdaka et al.
5,784,017 A *   7/1998  Craven ........................ 341/126
6,563,448 B1    5/2003  Fontaine
7,283,075 B2 * 10/2007  Lu et al. ..................... 341/143

(Continued)

FOREIGN PATENT DOCUMENTS

EP          1235403         8/2002

(Continued)

OTHER PUBLICATIONS

Jau J K et al: Polar Modulation-based RF Power Amplifiers with Enhanced Envelope Processing Technique; Microwave Conference, 2004; 34th European; Amsterdam, The Netherlands; Oct. 13, 2004, Piscataway, NJ, IEEE; pp. 1317-1320; XP010788343.

(Continued)

*Primary Examiner*—Brian Young
(74) *Attorney, Agent, or Firm*—McAndrews, Held & Malloy, Ltd.

(57) ABSTRACT

Aspects of a method and system for digital to analog conversion for power amplifier driver amplitude modulation are presented. Various aspects of the system may include circuitry that enables oversampling, within a single integrated circuit device, of each of a plurality of samples in a digital baseband signal. The circuitry may enable reduction of a number of bits, i.e., coarse quantization, in each of the oversampled plurality of samples so as to cause displacement of the quantization noise that occurred as a result of the coarse quantization. A subsequent signal may be generated based on the oversampled signal. The circuitry may enable the subsequent signal to be low-pass filtered utilizing filter circuitry in the single integrated circuit device, thereby attenuating the quantization noise displaced into the higher frequency range of the oversampled signal.

24 Claims, 10 Drawing Sheets

U.S. PATENT DOCUMENTS

| | | | |
|---|---|---|---|
| 7,362,251 B2 * | 4/2008 | Jensen et al. | 341/143 |
| 2006/0119493 A1 * | 6/2006 | Tal et al. | 341/143 |
| 2007/0018718 A1 | 1/2007 | Horng et al. | |

FOREIGN PATENT DOCUMENTS

| | | |
|---|---|---|
| TW | 249874 | 2/2006 |

OTHER PUBLICATIONS

Yves Geerts, Michel Steyaert; Design of Multi-bit Delta-Sigma A/D Converters; Jan. 1, 2002; Kluwer, Netherlands, XP002449461.

Nosworthy et al; Delta-Sigma Data Converters, Theory, Design and Simulation, Section 8.3.3; pp. 251-264; 1997; XP002082100.

Mucahit Kozak, Izzet Kale: Oversampled Delta-Sigma Modulators; Jan. 1, 2003; Kluwer, Netherlands; XP002449462.

* cited by examiner

METHOD AND SYSTEM FOR DIGITAL TO ANALOG CONVERSION FOR POWER AMPLIFIER DRIVER AMPLITUDE MODULATION

CROSS-REFERENCE TO RELATED APPLICATIONS/INCORPORATION BY REFERENCE

Not Applicable.

FIELD OF THE INVENTION

Certain embodiments of the invention relate to wireless communications. More specifically, certain embodiments of the invention relate to a method and system for digital to analog conversion for power amplifier driver amplitude modulation.

BACKGROUND OF THE INVENTION

Mobile communications have changed the way people communicate and mobile phones have been transformed from a luxury item to an essential part of every day life. The use of mobile phones today is dictated by social situations, rather than hampered by location or technology. While voice connections fulfill the basic need to communicate, and wireless voice and data connections continue to filter even further into the fabric of every day life, various integrated mobile multimedia applications, utilizing wireless and/or wired networks, may be the next step in the mobile communication revolution.

Third generation (3G) cellular networks offering various high speed access technologies and mobile telephones that have been specifically designed to utilize these technologies, fulfill demands for integrated multimedia applications supporting TV and audio applications utilizing advanced compression standards, high-resolution gaming applications, musical interfaces, peripheral interface support, etc. The processing requirements are being increased as chip designers take advantage of compression and higher bandwidths to transmit more information. 3G wireless applications support bit rates from 384 kilobits (Kbits)/second to 2 megabits (Mbits)/second, allowing chip designers to provide wireless systems with multimedia capabilities, superior quality, reduced interference, and a wider coverage area.

As mobile multimedia services grow in popularity and usage, factors such as power consumption, cost efficient optimization of network capacity and quality of service (QoS) continue to be even more essential to cellular operators than it is today. These factors may be achieved with careful network planning and operation, improvements in transmission methods, and advances in receiver techniques and chip integration solutions. To this end, carriers need technologies that will allow them to increase downlink throughput for the mobile multimedia applications support and, in turn, offer advanced QoS capabilities and speeds for consumers of mobile multimedia application services. Currently, mobile multimedia processors may not fully utilize system-on-a-chip (SoC) integration for advanced total system solution for today's mobile handsets. For example, conventional mobile processors may utilize a plurality of hardware accelerators to enable a variety of multimedia applications, which significantly increases power consumption, implementation complexity, mobile processor real estate, and ultimately terminal size.

Some mobile communications technologies, for example the global system for mobile communications (GSM), general packet radio service (GPRS), and enhanced data rates for GSM evolution (EDGE) may utilize polar modulation. Polar modulation may comprise converting a signal from a representation that utilizes in-phase (I), and quadrature phase (Q) components, to a corresponding representation that utilizes magnitude ($\rho$) and phase ($\phi$) components. Quantization noise may be introduced as a result of the conversion from the I and Q signal representation to the $\rho$ and $\phi$ signal representation. Consequently, at least a portion of the components in the $\rho$ and $\phi$ signal representation may be filtered.

While some conventional polar modulation transceiver designs may comprise circuitry that enables conversion from the I and Q signal representation to the $\rho$ and $\phi$ signal representation to be performed within a single integrated circuit device, or chip, the characteristics of the filtering circuitry may result in designs in which the filtering circuitry being located within a separate chip or off-chip as a discrete component filter.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for digital to analog conversion for power amplifier driver amplitude modulation, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for digital to analog conversion for power amplifier driver amplitude modulation. One aspect of the invention comprises circuitry that enables amplitude control for a signal generated in a polar amplitude transmitter. The system may comprise circuitry in a single integrated circuit device, or chip, that enables a conversion of a baseband digital signal to an oversampled subsequent signal. The oversampling may enable the subsequent signal to be filtered by filtering circuitry contained within the single integrated circuit device. The filtered subsequent signal may be utilized to control a power amplifier. The power amplifier may receive a phase modulated signal and generate an amplified signal. The power amplifier may vary an amplitude of the amplified signal based on the filtered subsequent signal.

Figure 1A:
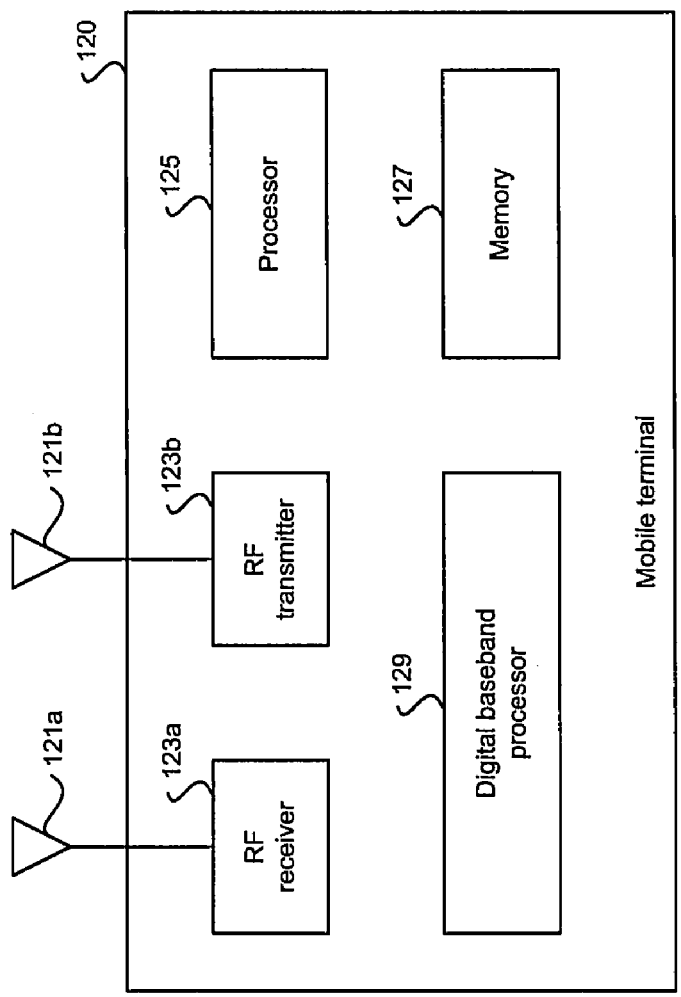
FIG. 1A is a block diagram illustrating an exemplary mobile terminal, in accordance with an embodiment of the invention.

FIG. 1A is a block diagram illustrating an exemplary mobile terminal, in accordance with an embodiment of the invention. Referring to FIG. 1A, there is shown a mobile terminal 120 that may comprise an RF receiver 123a, an RF transmitter 123b, a digital baseband processor 129, a processor 125, and a memory 127. A receive antenna 121a may be communicatively coupled to the RF receiver 123a. A transmit antenna 121b may be communicatively coupled to the RF transmitter 123b.

The RF receiver 123a may comprise suitable logic, circuitry, and/or code that may enable processing of received RF signals. The RF receiver 123a may enable receiving RF signals in a plurality of frequency bands. The RF receiver 123a may enable receiving signals in cellular frequency bands, for example, GSM, GPRS, and/or EDGE. Each frequency band supported by the RF receiver 123a may have a corresponding front-end circuit for handling low noise amplification and down conversion operations, for example.

The RF receiver 123a may down convert the received RF signal to a baseband frequency signal that comprises an in-phase (I) component and a quadrature (Q) component. In some instances, the RF receiver 123a may enable analog-to-digital conversion of the baseband signal components before transferring the components to the digital baseband processor 129.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b.

The RF transmitter 123b may comprise suitable logic, circuitry, and/or code that may enable processing of RF signals for transmission via a wireless medium. The RF transmitter 123b may enable transmission of RF signals in a plurality of frequency bands. Moreover, the RF transmitter 123b may enable transmission of signals in cellular frequency bands, for example. Each frequency band supported by the RF transmitter 123b may have a corresponding front-end circuit for handling amplification and/or up conversion operations, for example.

The RF transmitter 123b may up convert the baseband frequency signal comprising I/Q components to an RF signal. In some instances, the RF transmitter 123b may enable digital-to-analog conversion of the baseband signal components received from the digital baseband processor 129 before up conversion.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120. The processor 125 may also enable execution of applications that may be utilized by the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the mobile terminal 120.

Figure 1B:
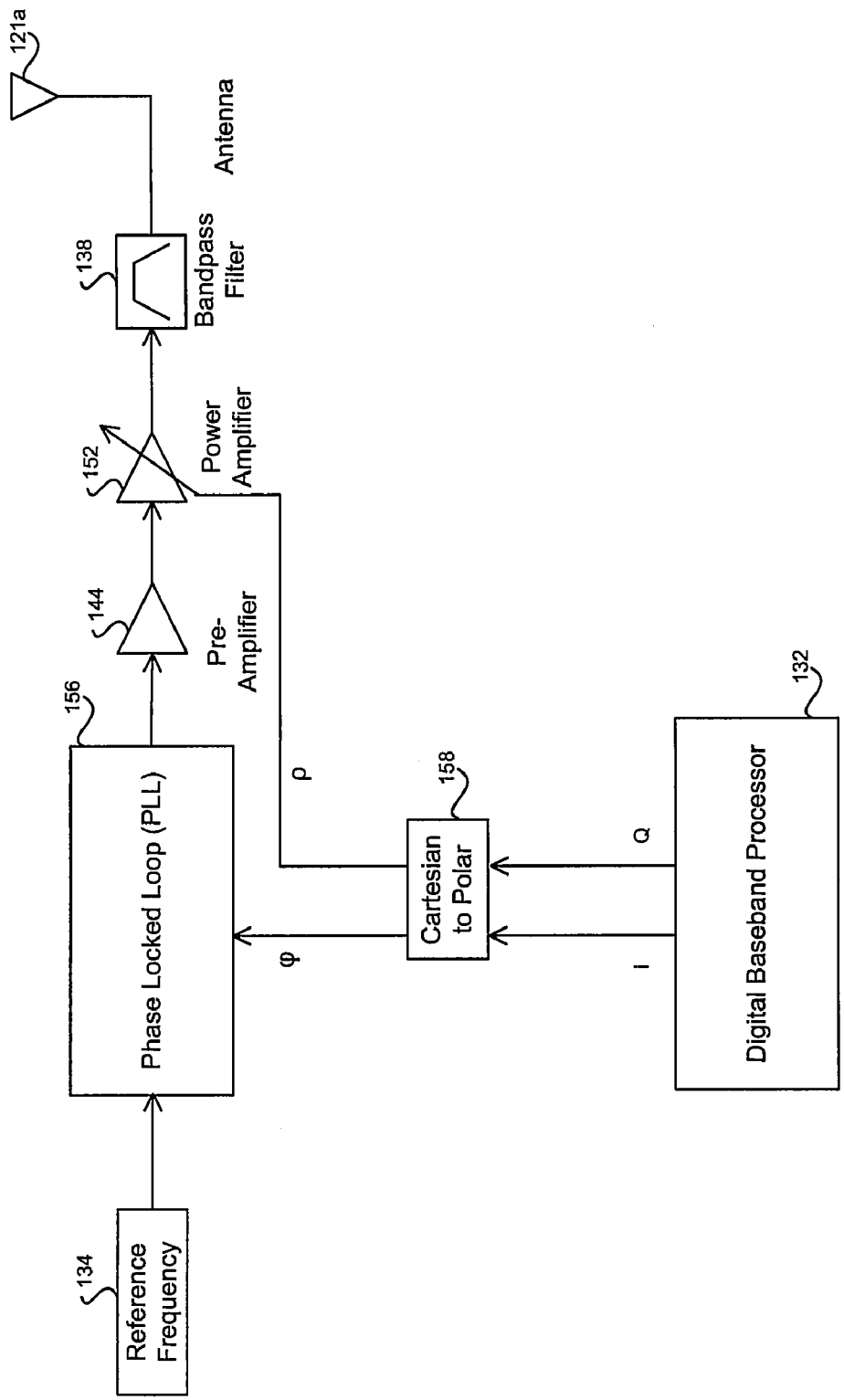
FIG. 1B is a block diagram illustrating an exemplary polar modulation transmitter, which may be utilized in connection with an embodiment of the invention.

FIG. 1B is a block diagram illustrating an exemplary polar modulation transmitter, which may be utilized in connection with an embodiment of the invention. Referring to FIG. 1B, there is shown a digital baseband processor 132, a reference frequency block 134, a power amplifier 152, a bandpass filter 138, a transmit antenna 121b, a phase locked loop (PLL) 156, a preamplifier 144, and a Cartesian to polar conversion block 158. The polar modulation transmitter, as illustrated in FIG. 1B, may be part of a mobile terminal, such as the mobile terminal 120 in FIG. 1A, for example.

The reference frequency block 134 may comprise suitable logic, circuitry, and/or code that may enable generation of local oscillator (LO) and/or carrier frequency signals. The reference frequency block 134 may comprise a crystal, which may be utilized for generating the LO signals.

The digital baseband processor 132 may comprise suitable logic, circuitry, and/or code that may enable processing and/or handling of baseband frequency signals. The digital baseband processor may generate a digital baseband signal comprising in-phase (I) and quadrature phase (Q) components. The digital baseband signal may comprise a plurality of samples and each sample may comprise a plurality of bits, for example 12 bits. The samples within the digital baseband signal may occur at a sampling rate, for example 13 MHz. Each sample in the baseband digital signal, which may represent a plurality of signal levels, for example $2^{12}$, or 4,096, signal levels.

The bandpass filter 138 may comprise suitable logic, circuitry, and/or code that may enable generation of an output signal by processing and input signal to attenuate input signal amplitudes for a range of electromagnetic frequencies below a low frequency, $f_{LOW}$, and above a high frequency, $f_{HIGH}$. The range of frequencies that are greater than or equal to $f_{LOW}$ and less than or equal to $f_{HIGH}$ may comprise a pass band.

The preamplifier 144 may comprise suitable logic, circuitry, and/or code that may enable generation of an output signal whose signal level comprises a fixed or variable attenuation in comparison to a signal level associated with a corresponding input signal.

The power amplifier 152 may comprise suitable logic, circuitry, and/or code that may enable generation of an output signal, based on an input signal, with sufficient electrical power, that amplitude associated with the output signal may be maintained when the output signal is applied to an electrical load. The power amplifier 152 may be characterized by a linear operation when a change in amplitude for the input signal corresponds to a proportional change in amplitude for the output signal. The gain associated with the power amplifier 152 may be variable based on a received gain control input signal.

The Cartesian to polar conversion block 158 may comprise suitable logic, circuitry, and/or code that may enable generation of magnitude and phase components corresponding to a received input signal. The Cartesian to polar conversion block 158 may receive a digital baseband signal comprising I and Q components. The Cartesian to polar conversion block 158 may generate a representation of the digital baseband signal that comprises a magnitude ($\rho$) component, and a phase ($\phi$) component. The magnitude component may represent amplitude modulated signal component, and the phase component may represent a phase modulated signal component.

In various embodiments of the invention, circuitry utilized in connection with the Cartesian to polar conversion block 158 may generate a digital subsequent signal that represents an oversampling of the digital baseband signal, while generating the p component. The oversampling may result in one sample within the digital baseband signal corresponding to a plurality of samples within the digital subsequent signal. The sampling rate for the digital subsequent signal may be greater than the corresponding sampling rate for the digital baseband signal. For example, while the sampling rate for an exemplary digital baseband signal may be 13 MHz, the sampling rate for the digital subsequent signal may be 400 MHz. Each sample in the digital baseband signal, which may represent a plurality of signal levels, for example $2^{12}$, may be converted to a sample in a digital subsequent signal that comprises about 2 bits, which may represent fewer signal levels, for example 3. The exemplary 3 levels may comprise a level 0, level 1, and a level 2, for example. The signal levels may correspond to voltage levels in an analog signal. Consequently, each sample in the digital subsequent signal may be represented by a plurality of bits that may be fewer in number than the corresponding plurality of bits contained within a sample in the baseband digital signal. For example, approximately 2 bits may represent each sample in the subsequent signal. The reduction in the number of bits per sample may enable digital to analog conversion within a single integrated circuit device that processes approximately 2 bits per sample at a rate of 400 million samples per second, for example.

The conversion from a digital baseband signal, which comprises 12-bit samples, to an analog subsequent signal, which comprises corresponding values for 1 of 3 signal levels selected based on the 12 bit samples, may introduce quantization noise. Various embodiments of the invention may comprise circuitry that modulates the digital subsequent signal in a way that biases the quantization noise to high frequency components within the analog subsequent signal. During digital to analog conversion, in which a digital subsequent signal comprising a plurality of 2 bit digital samples is converted to an analog signal comprising a corresponding 1 of 3 signal levels for example, the analog signal may be low pass filtered to attenuate the introduced quantization noise.

The oversampling of the digital baseband signal may enable implementation of low pass filter circuitry that may be characterized by a relatively high cutoff frequency, $f_{HIGH}$, for example 1 MHz. The relatively high cutoff frequency may enable practical integration of the low pass filter circuitry within the single integrated circuit device. In some conventional power amplifier driver circuitry, the low pass filter circuitry may require large capacitive value components resulting in the low pass filter circuitry being implemented within a separate integrated circuit device, or in discrete component form outside the integrated circuit.

The fractional-N synthesizer 156 may comprise suitable logic, circuitry, and/or code that may enable utilization of the phase modulated signal component to generate a synthesized RF signal. The fractional-N synthesizer 156 may generate the synthesized RF signal based on an input IF signal. The fractional-N synthesizer 156 may generate a change in signal level and/or frequency for the synthesized RF signal based on a corresponding change in the input IF signal. The fractional-N synthesizer 156 may perform calibration and predistortion procedures to equalize the corresponding change across a range of frequencies, substantially as described for the fractional-N synthesizer 142.

In operation, the digital baseband processor 132 may provide a baseband signal comprising I and Q signal components. The I and Q components may be communicated to the Cartesian to polar conversion block 158. The Cartesian to polar conversion block 158 may generate magnitude ($\rho$) and phase ($\phi$) signal components, which correspond to the received I and Q, signal components. The phase signal component may be communicated to the PLL 156. The PLL 156 may utilize the phase signal component, and the LO signal and/or carrier frequency signal from the reference frequency block 134, to generate an RF synthesized signal. The frequency associated with the RF synthesized signal may be based on the carrier frequency derived from an input signal received from the reference frequency block 134.

The preamplifier 144 may modify the amplitude associated with the RF synthesized signal. The amplitude modified RF synthesized signal may comprise an output RF synthesized signal. The power amplifier 136 may modify the amplitude associated with the output RF synthesized signal. The power amplifier 136 may modify the amplitude associated with the output RF synthesized signal based on the magnitude component signal, received from the Cartesian to polar conversion block 158. The output RF synthesized signal may comprise signal components that span a range of frequencies. The bandpass filter 138 may band limit the amplified output RF synthesized signal by reducing signal levels for signal components associated with frequencies that are not within the pass band for the bandpass filter 138. The transmit antenna 121b may enable the band limited signal to be transmitted via a wireless medium.

Figure 2:
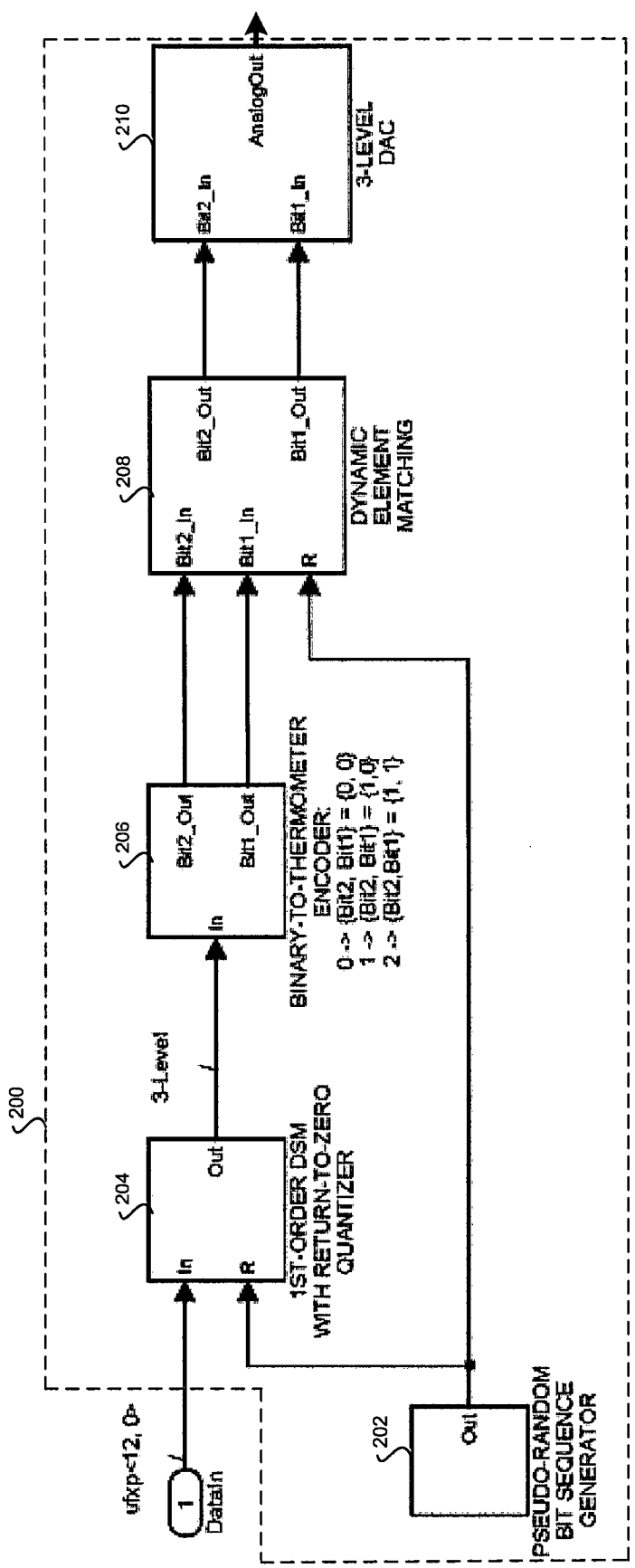
FIG. 2 is a block diagram of an exemplary system for digital to analog conversion for power amplifier driver amplitude modulation, in accordance with an embodiment of the invention.

FIG. 2 is a block diagram of an exemplary system for digital to analog conversion for power amplifier driver amplitude modulation, in accordance with an embodiment of the invention. Referring to FIG. 2, there is shown a single integrated circuit device 200. The single integrated circuit device 200 may comprise a pseudo random bit sequence generator 202, a delta sigma modulation quantizer 204, a binary encoder 206, a dynamic element matching block 208, and a digital to analog converter (DAC) block 210.

The pseudo random bit sequence generator 202 may comprise suitable logic, circuitry, and/or code that may enable generation of a plurality of bits. Taken as a group, the binary values for the plurality of bits may represent a pseudo random sequence. The pseudo random sequence may be generated based on a seed value.

The delta sigma modulation quantizer 204 may comprise suitable logic, circuitry, and/or code that may enable generation of a K level output signal wherein K may represent a number. In an exemplary embodiment of the invention K=3. The delta sigma modulation quantizer 204 may generate the K level output signal based on a digital baseband signal comprising a plurality of samples, and on a pseudo random bit sequence. Each sample in the digital baseband signal may comprise a plurality of M bits. In an exemplary digital baseband signal M=12. The samples within the digital baseband signal may occur at a sampling rate, for example 13 MHz. Each sample in the K level output signal may comprise a plurality of levels, for example 3 levels. The exemplary 3 levels may comprise a level 0, a level 1, and a level 2. The 3 levels may be represented by a corresponding plurality of bits, for example 1.5 bits, or approximately 2 bits. The samples within the K level output signal may occur at a sampling rate, for example 400 MHz.

The delta sigma modulation quantizer 204 may compute a difference value based on an addition value, based on a current sample from the digital baseband signal, and a value based on a current sample from the K level output signal. The computed difference value may be added to a value based on a subsequent sample from the digital baseband signal, and to a dithering value based on the pseudo random bit sequence.

The delta sigma modulation quantizer 204 may generate a K level output signal based on a plurality of computed difference values. An exemplary K level output signal may comprise a current sample, whose value may be chosen from one of the K levels based on a current difference value, followed by a succeeding sample, whose value is level 0, followed by a succeeding sample, whose value may be chosen from one of the K levels based on a subsequent difference value. In various embodiments of the invention, the exemplary K level output signal may be generated based on return to zero quantization.

During the conversion from M bit samples in a digital baseband signal, to corresponding levels in a K level output signal, quantization noise may be introduced. The delta sigma modulation quantizer 204 may generate a high pass shaped dithering signal, comprising a plurality of dithering values, based on the pseudo random bit sequence. The high pass shaped dither signal, when added during the addition function, may cause the quantization noise present in the K level output signal to be highly uncorrelated with the input signal and thus well modeled as an additive "white" noise source. The delta sigma modulation quantizer 204 may cause the quantization noise to occur predominantly at the high end of the frequency spectrum associated with the output signal. The displacement of the quantization noise to the high end of the frequency spectrum may facilitate filtering of the quantization noise by utilizing a low pass filter. In various embodiments of the invention, the low pass filter circuitry and the delta sigma modulation quantizer circuitry 204 may be integrated within a single integrated circuit (IC) device.

The binary encoder 206 may comprise suitable logic, circuitry, and/or code that may generate a digital subsequent signal based on conversion of individual samples from a K level input signal to corresponding N bit binary samples, wherein N may represent a number. Each binary sample may be represented as a binary tuple comprising {bit N, bit N−1, . . . , bit 1}, for example. The value of N may be such that $2^N \leq K$. In an exemplary embodiment of the invention M=3, and N=2, wherein the correspondence between levels and bit values may be as follows: level 0 corresponds to the bit tuple {0, 0}, level 1 corresponds to the bit tuple {1, 0}, and level 2 corresponds to the bit tuple {1, 1}.

The dynamic element matching block 208 may comprise suitable logic, circuitry, and/or code that may enable generation of switching control bits by conversion of bit values in a received digital signal, comprising N bit binary samples, based on a pseudo random bit sequence. The dynamic element matching block 208 may generate L switching control bits based on each N bit binary sample, for example. In an exemplary embodiment of the invention, L=2, and N=2. The dynamic element matching block 208 may receive a sample in a received digital signal that comprises a bit tuple {1, 0} and generate switching control bits represented by a bit tuple {1, 0} based on a current value in the pseudo random bit sequence. The dynamic element matching block 208 may receive a sample in a received digital signal that comprises a bit tuple {1, 0} and generate switching control bits represented by a bit tuple {0, 1} based on a subsequent value in the pseudo random bit sequence.

The DAC block 210 may comprise suitable logic, circuitry, and/or code that may enable generation of an analog output signal based on a received digital signal. The digital signal may comprise a plurality of N bit binary samples. The DAC block 210 may convert the binary samples to a corresponding one of K signal levels that may be utilized to generate an analog output signal. In an exemplary embodiment of the invention K=3, and N=2, wherein the correspondence between bit values and levels may be as follows: the bit tuple {0, 0} corresponds to signal level 0, the bit tuples {0, 1} and {1, 0} correspond to signal level 1, and the bit tuple {1, 1} corresponds to signal level 2.

In various embodiments of the invention, the signal level in the analog output signal may correspond to a voltage level that may be generated by activating transistor circuitry. At least a portion of the transistor circuitry may be activated and/or deactivated based on individual bit values in a current N bit binary sample. The activated transistor circuitry may initiate current flow through output resistor and capacitor circuitry. The signal level in the analog output signal may be based on a voltage level associated with the output resistor and capacitor circuitry.

The performance characteristics of a transistor may vary based on process variations that may occur during integrated circuit manufacture. This may be referred to as a mismatch. Consequently, current flow through one transistor in the chip may differ from current flow through another nominally identical transistor in the chip, for a given input voltage level applied to each transistor. As a result, a voltage level corresponding to a signal level in the analog output signal may vary depending upon which transistors were activated and/or deactivated within the DAC circuitry. The variation may be referred to as mismatch noise, which may be introduced into the analog output signal based on the mismatch of transistors within the chip.

In various embodiments of the invention, a level of mismatch noise in the analog output signal may be attenuated based on a method referred to as dynamic element matching. In dynamic element matching, a voltage level corresponding to a signal level in the analog output signal may be generated by alternating which transistors are activated or deactivated at different time instants when the signal level is to be generated. In an exemplary embodiment of the invention, at a given time instant a signal level 1 may be generated based on a received bit tuple {0, 1}. This bit tuple may result in an activation of a first transistor, and a deactivation of a second transistor. A corresponding voltage level may be generated for the output signal corresponding to the signal level 1. At a subsequent time instant, a signal level 1 may be generated based on a received bit tuple {1, 0}. This subsequent bit tuple may result in deactivation of the first transistor, and activation of the second transistor. A corresponding subsequent voltage level may be generated for the output signal corresponding to the signal level 1 at the subsequent time instant. When measured over a time duration spanning a plurality of binary samples, dynamic element matching may enable a reduction of in-band mismatch noise when compared to some conventional circuit designs for digital to analog conversion.

In operation, the pseudo random bit sequence generator 202 may generate a pseudo random sequence. The pseudo random sequence may be utilized by the delta sigma modulation quantizer 204, and the dynamic element matching block 208. The delta sigma modulation quantizer 204 may receive a digital baseband signal and generate a K level output signal. The binary encoder 206 may convert the K level output signal to a digital subsequent signal comprising N bit binary samples. An N bit tuple value may correspond to one level among the K levels in the output signal.

The dynamic element matching block 208 may receive the digital subsequent signal from the binary encoder 206. The dynamic element matching block 208 may generate switching control bits by modifying bits in the digital subsequent signal based on the received pseudo random sequence. The modified bits may comprise binary complements of the corresponding bits received in the digital subsequent signal. The dynamic element matching block 208 may modify bits in the received digital subsequent signal when the N bit sample comprises a data word whose value may be greater than the lowest value and less than the highest value for the N bit data word. For example, in an exemplary embodiment of the invention wherein N=2, a lowest value may be equal to 0, corresponding to a bit tuple {0, 0}, and a highest value may be equal to 3, corresponding to a bit tuple {1, 1}. The dynamic element matching block may modify bits in a received digital subsequent word when the N bit data word is equal to 1, corresponding to a bit tuple {0, 1}, or 2, corresponding to a bit tuple {1, 0}. Based on the pseudo random bit sequence, the dynamic element matching block 208 may modify a bit tuple {0, 1} to generate a bit tuple {1, 0}, or vice versa.

The DAC block 210 may receive switching control bits from the dynamic element matching block 208. The DAC block may utilize the switching control block to perform digital to analog conversion for a signal level represented by the switching control bits. The DAC block 210 may utilize the switching control bits to activate and/or deactivate transistor circuitry that may result in a corresponding voltage level. The voltage level may be utilized to generate an analog output signal. The analog output signal from the DAC block may be utilized generate a magnitude component as illustrated for the Cartesian to polar conversion block 158 (FIG. 1B).

Figure 3:
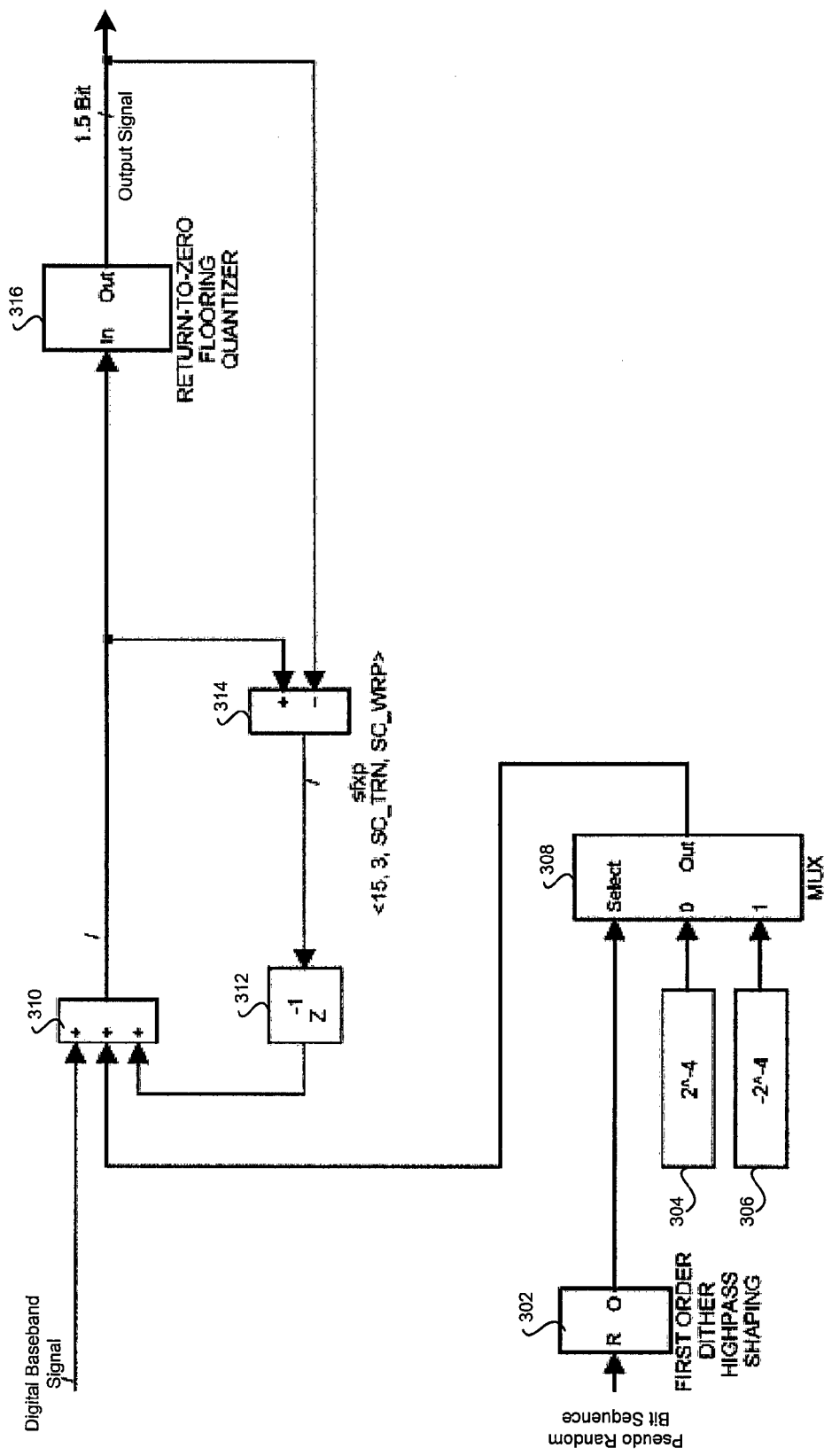
FIG. 3 is a block diagram of an exemplary system for delta sigma modulation, in accordance with an embodiment of the invention.

FIG. 3 is a block diagram of an exemplary system for delta sigma modulation, in accordance with an embodiment of the invention. The function for the system for delta sigma modulation as illustrated in FIG. 3 may be substantially as described for the delta sigma modulation quantizer 204 (FIG. 2). Referring to FIG. 3, there is shown a dithering block 302, a binary generation block 304, a complementary binary generation block 306, a multiplexer 308, an adder block 310, a time delay block 312, a difference block 314, and a return to zero quantizer 316.

The dithering block 302 may comprise suitable logic, circuitry, and/or code that may enable generation of dithering selection bits from a received pseudo random bit sequence. The dithering selection bits may be utilized to enable generation of a high pass shaped dither signal.

The binary generation block 304 may comprise suitable logic, circuitry, and/or code that may enable generation of bits based on a seed number. In an exemplary embodiment of the invention, a seed number value of $2^{-4}$ may be utilized.

The complementary binary generation block 306 may comprise suitable logic, circuitry, and/or code that may enable generation of bits based on a seed number. The bits may comprise a two's complement, or one's complement representation, for example. In an exemplary embodiment of the invention, a seed number value of $-2^{-4}$ may be utilized.

The multiplexer 308 may comprise suitable logic, circuitry, and/or code that may enable generation of at least one output signal based on a plurality of input signals. Input signals may be selected for output based on a selector input comprising one or more bits. In an exemplary embodiment of the invention, the multiplexer 308 may comprise a 1 bit select input, two input signals, and one output signal. One of the two input signals may be associated with a binary value 0, while the other input signal may be associated with a binary value 1. The input signal associated with the binary value 0 may be selected for output when the select input receives an input with a binary value 0. The input signal associated with the binary value 1 may be selected for output when the select input receives an input with a binary value 1. The output signal from the multiplexer 308 may comprise a high pass shaped dither signal.

The adder block 310 may comprise suitable logic, circuitry, and/or code that may enable generation of an addition value. The addition value may be computed based on a received digital baseband signal, a high pass shaped dither signal, and a difference signal.

The time delay block 312 may comprise suitable logic, circuitry, and/or code that may enable generation of an output signal based on an input signal, wherein a value for the output signal at a current time instant corresponds to a value for the input signal at a previous time instant. The difference block 314 may comprise suitable logic, circuitry, and/or code that may enable generation of a difference value based on a current addition value and on a value for a current sample from an output signal. The return to zero quantizer 316 may comprise suitable logic, circuitry, and/or code that may enable generation of a K level output signal based on values of computed addition values.

In operation, the dithering block 302 may receive bits from a pseudo random bit sequence. The pseudo random bit sequence may be utilized to generate dithering selection bits. The dithering selection bits may be output and utilized as input to the multiplexer 308. Based on a value for a current dithering selection bit, the multiplexer 308 may select an input from the binary generation block 304 or the complementary binary generation block 306. Based on the selection, the multiplexer 308 may generate a high pass shaped dither signal.

The adder block 310 may generate a current addition value based on a current sample from a digital baseband signal, a current value from a high pass shaped dither signal, and a time delayed difference value received from the time delay block 312. The difference block 314 may compute a current difference value based on a current addition value and a current sample value from an output signal generated by the return to zero quantizer 316. The return to zero quantizer 316 may generate a value for a current sample in the output signal based on a current addition value.

Figure 4:
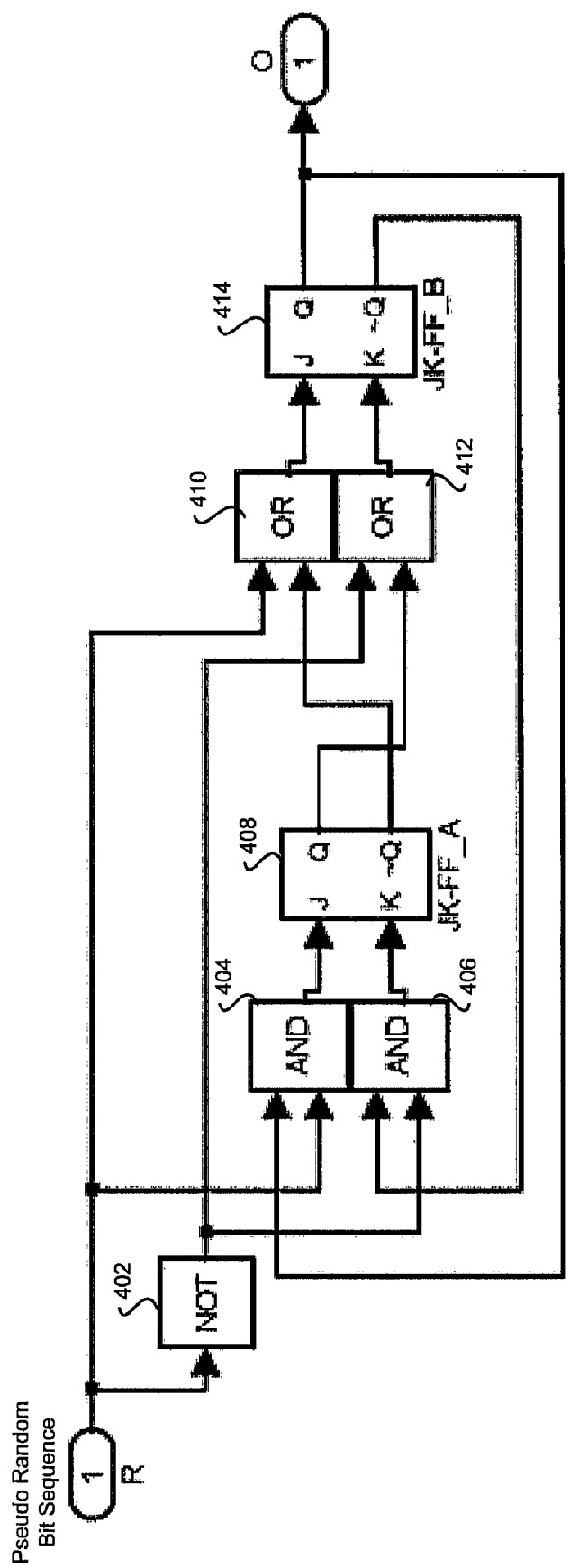
FIG. 4 is a block diagram of an exemplary system for high pass shaped dither generation, in accordance with an embodiment of the invention.

FIG. 4 is a block diagram of an exemplary system for high pass shaped dither generation, in accordance with an embodiment of the invention. The system for high pass shaped dither, as illustrated in FIG. 4, may enable generation of dithering selection bits, which may be utilized for generating a high pass shaped dither signal as described for the delta sigma modulation quantizer 204 (FIG. 2), and the dithering block 302 (FIG. 3). Referring to FIG. 4, there is shown a logical negation block 402, a plurality of logical AND blocks 404 and 406, a plurality of JK flip flop blocks 408 and 414, and a plurality of logical OR blocks 410 and 412.

The logical negation block 402 may comprise suitable logic, circuitry, and/or code that may enable generation of an output signal that comprises binary values that are binary complements of corresponding binary values in an input signal.

The logical AND block 404 may comprise suitable logic, circuitry, and/or code that may enable generation of a binary output value that is based on a logical AND of current binary values for each of a plurality of input signals. In an exemplary embodiment of the invention, the logical AND block 404 may comprise 2 inputs and 1 output. The logical AND block 406 may be substantially as described for the logical AND block 404.

The JK flip-flop block 408 may comprise suitable logic, circuitry, and/or code that may enable generation of complementary binary outputs, Q and ~Q based on a binary J input signal and a binary K input signal. A current binary value for the J input signal of logical HIGH may enable the corresponding binary value for the Q output signal to be set to a binary value of logical HIGH. The corresponding binary value for the ~Q output may be set to a binary value of logical LOW. A current binary value for the K input signal of logical HIGH may enable the corresponding binary value for the Q output to be set to a binary value of logical LOW. The corresponding value for the ~Q output may be set to a binary value of logical HIGH. The JK flip-flop 414 may be substantially as described for the JK flip flop 408.

The logical OR block 410 may comprise suitable logic, circuitry, and/or code that may enable generation of a binary output value that is based on a logical OR of current binary values for each of a plurality of input signals. In an exemplary embodiment of the invention, the logical OR block 410 may comprise 2 inputs and 1 output. The logical OR block 412 may be substantially as described for the logical OR block 410.

In operation, the logical negation block 402 may receive bits from a pseudo random sequence and generate an output sequence that comprises bits that are binary complements to corresponding bits in the pseudo random sequence. The logical AND block 404 may receive bits from the pseudo random sequence and from the Q output from the JK flip-flop 414. The logical AND block 406 may receive bits from the logical negation block 402 and from the ~Q output from the JK flip-flop 414. The output from the logical AND block 404 may be coupled to the J input of the JK flip-flop 408. The output from the logical AND block 406 may be coupled to the K input of the JK flip-flop 408. The Q output from the JK flip-flop 408 may be coupled to an input of the logical OR block 412. The ~Q output from the JK flip-flop 408 may be coupled to an input of the logical OR block 410. The logical OR block 410 may also receive bits from the pseudo random sequence. The logical OR block 412 may also receive bits from the logical negation block 402. The output from the logical OR block 410 may be coupled to the J input of the JK flip-flop 414. The output from the logical OR block 412 may be coupled to the K input of the JK flip-flop 414. The Q output from the JK flip-flop 414 may comprise generated dithering selection bits.

Figure 5:
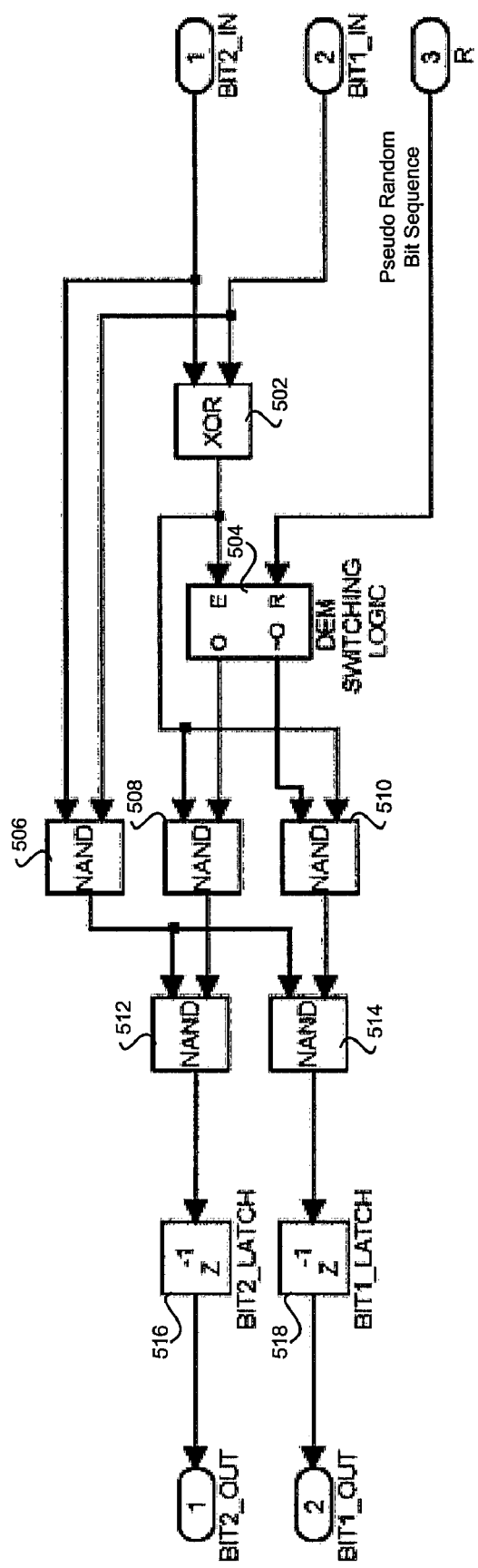
FIG. 5 is a block diagram of an exemplary system for generating control signals for digital to analog conversion, in accordance with an embodiment of the invention.

FIG. 5 is a block diagram of an exemplary system for generating control signals for digital to analog conversion, in accordance with an embodiment of the invention. The system for generating control signals for digital to analog conversion, as illustrated in FIG. 5, may be substantially as described for the dynamic element matching block 208 (FIG. 2). Referring to FIG. 5, there is shown a logical exclusive or (XOR) block 502, a dynamic element matching logic block 504, a plurality of logical negative AND blocks 506, 508, 510, 512, and 514, and a plurality of time delay blocks 516 and 518. The plurality of time delay blocks 516 and 518 may be substantially as described for the time delay block 312 (FIG. 3).

The dynamic element matching logic block 504 may comprise suitable logic, circuitry, and/or code that may enable generation of switching control bits. The switching control bits may comprise complementary binary outputs O and ~O from the dynamic element matching block 504. A current binary value for the ~O output may comprise a complementary value in comparison to a current binary value for the O output. The complementary binary outputs O and ~O may be generated based on a corresponding binary E input and a binary R input.

The logical XOR block 502 may comprise suitable logic, circuitry, and/or code that may enable generation of a binary output value based on a logical XOR of current binary values for each of a plurality of input signals. In an exemplary embodiment of the invention, the logical XOR block 502 may comprise 2 inputs and 1 output.

The logical NAND block 506 may comprise suitable logic, circuitry, and/or code that may enable generation of a binary output value that is based on a logical negated AND, or NAND, of current binary values for each of a plurality of input signals. In an exemplary embodiment of the invention, the logical NAND block 506 may comprise 2 inputs and 1 output. The logical NAND blocks 508, 510, 512, and 514 may be substantially as described for the logical NAND block 506.

In operation the logical XOR block 502 may receive inputs from signals Bit2_In and Bit1_In. The input signals may correspond to samples in a received digital signal from the binary encoder 206 (FIG. 2), wherein each sample may be represented by a bit tuple {bit 2, bit 1}. The bit value Bit2_In may correspond to bit 2 within the tuple, and the bit value Bit1_In may correspond to the bit 1 within the tuple. The output from the logical XOR block 502 may be coupled to an input of the dynamic element matching logic block 504. The dynamic element matching logic block 504 may also receive an input from the pseudo random bit sequence. The logical NAND block 506 may receive input from signals Bit2_In and Bit1_In. The logical NAND block 508 may receive input from the output of the logical XOR block 502, and from the O output from the dynamic element matching logic block 504. The logical NAND block 510 may receive input from the output of the logical XNOR block 502 and from the ~O output from the dynamic element matching logic block 504. The logical NAND block 512 may receive input from the output of the logical NAND block 506 and from the output of the logical NAND block 508. The logical NAND block 514 may receive input from the output of the logical NAND block 506 and from the output of the logical NAND block 510. The time delay block 516 may generate bit 2 of a switching control bit tuple based on a time delayed version of the output from the logical NAND gate 512. The time delay block 518 may generate bit 1 of a switching control bit tuple based on a time delayed version of the output from the logical NAND gate 514.

Figure 6:
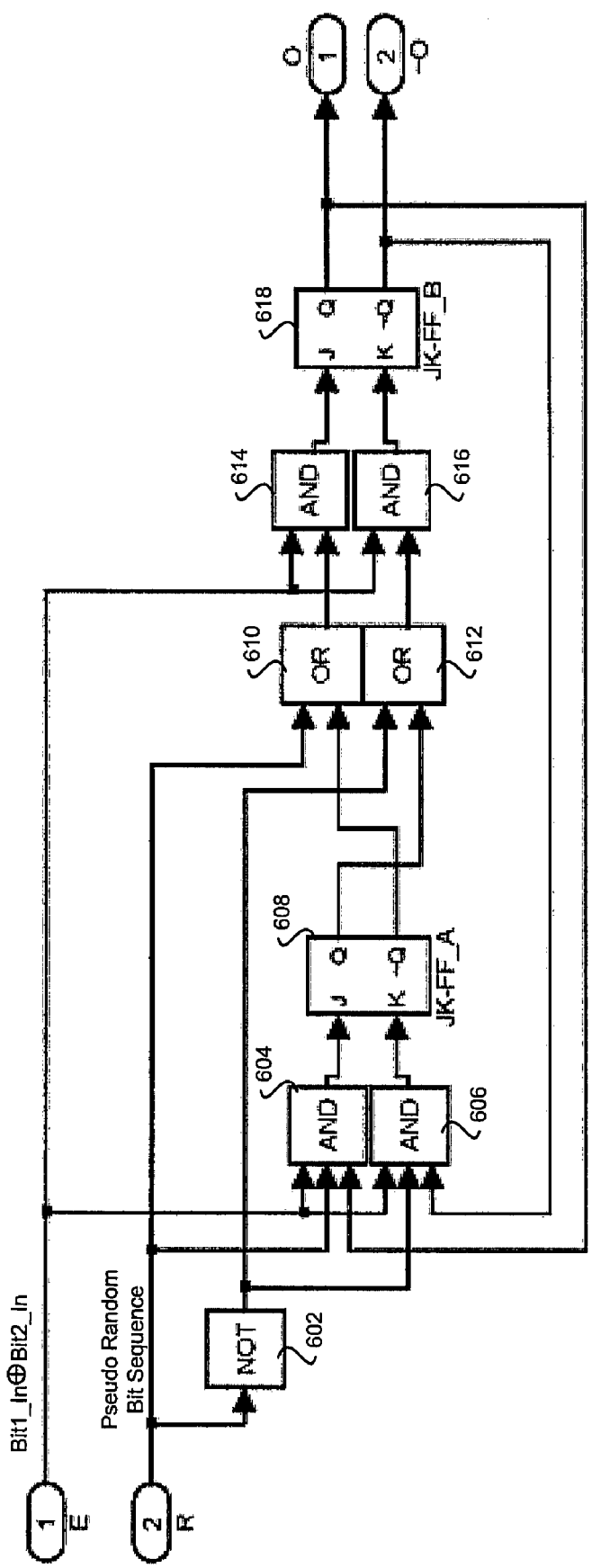
FIG. 6 is a diagram of an exemplary system for dynamic element matching, in accordance with an embodiment of the invention.

FIG. 6 is a diagram of an exemplary system for dynamic element matching, in accordance with an embodiment of the invention. The system for dynamic element matching, as illustrated in FIG. 6, may be substantially as described for the dynamic element matching block 208 (FIG. 2), and presents a detailed view of the circuitry associated with the dynamic element matching logic block 504 (FIG. 5). Referring to FIG. 6, there is shown a logical negation block 602, a plurality of logical AND blocks 604, 606, 614, and 616, a plurality of JK flip flop blocks 608 and 618, and a plurality of logical OR blocks 610 and 612. The logical negation block 602 may be substantially as described for the logical negation block 402 (FIG. 4). The logical OR blocks 610 and 612 may be substantially as described for the logical OR block 410. The logical AND blocks 604, 606, 614 and 616 may be substantially as described for the logical AND block 404. In an exemplary embodiment of the invention, the logical AND blocks 604 and 606 may each comprise 3 inputs and 1 output. The JK flip-flop blocks 608 and 618 may be substantially as described for the JK flip flop 408.

In operation, the logical negation block 602 may receive bits from a pseudo random sequence and generate an output sequence that comprises bits that are binary complements to corresponding bits in the pseudo random sequence. The logical AND block 604 may receive bits from the pseudo random sequence, from the Q output from the JK flip flop 618, and an input generated based on a logical XOR of bits in the bit tuple {bit 2, bit 1} from the binary encoder 206 (FIG. 2). The logical AND block 606 may receive bits from the logical negation block 402, from the ~Q output from the JK flip flop 618, and the input generated based on a logical XOR of bits in the bit tuple {bit 2, bit 1} from the binary encoder 206.

The output from the logical AND block 604 may be coupled to the J input of the JK flip-flop 608. The output from the logical AND block 606 may be coupled to the K input of the JK flip-flop 608. The Q output from the JK flip-flop 608 may be coupled to an input of the logical OR block 612. The ~Q output from the JK flip-flop 608 may be coupled to an input of the logical OR block 610. The logical OR block 610 may also receive bits from the pseudo random sequence. The logical OR block 612 may also receive bits from the logical negation block 602. The output from the logical OR block 610 may be coupled to an input of the logical AND block 614. The logical AND block 614, and logical AND block 616, may each also receive the input generated based on a logical XOR of bits in the bit tuple {bit 2, bit 1} from the binary encoder 206.

The output from the logical AND block 614 may be coupled to the J input of the JK flip-flop 618. The output from the logical AND block 616 may be coupled to the K input of the JK flip-flop 618. The Q output from the JK flip-flop 618 may correspond to the O output from the dynamic element matching logic block 504. The ~Q output from the JK flip-flop 618 may correspond to the ~O output from the dynamic element matching logic block 504.

Figure 7:
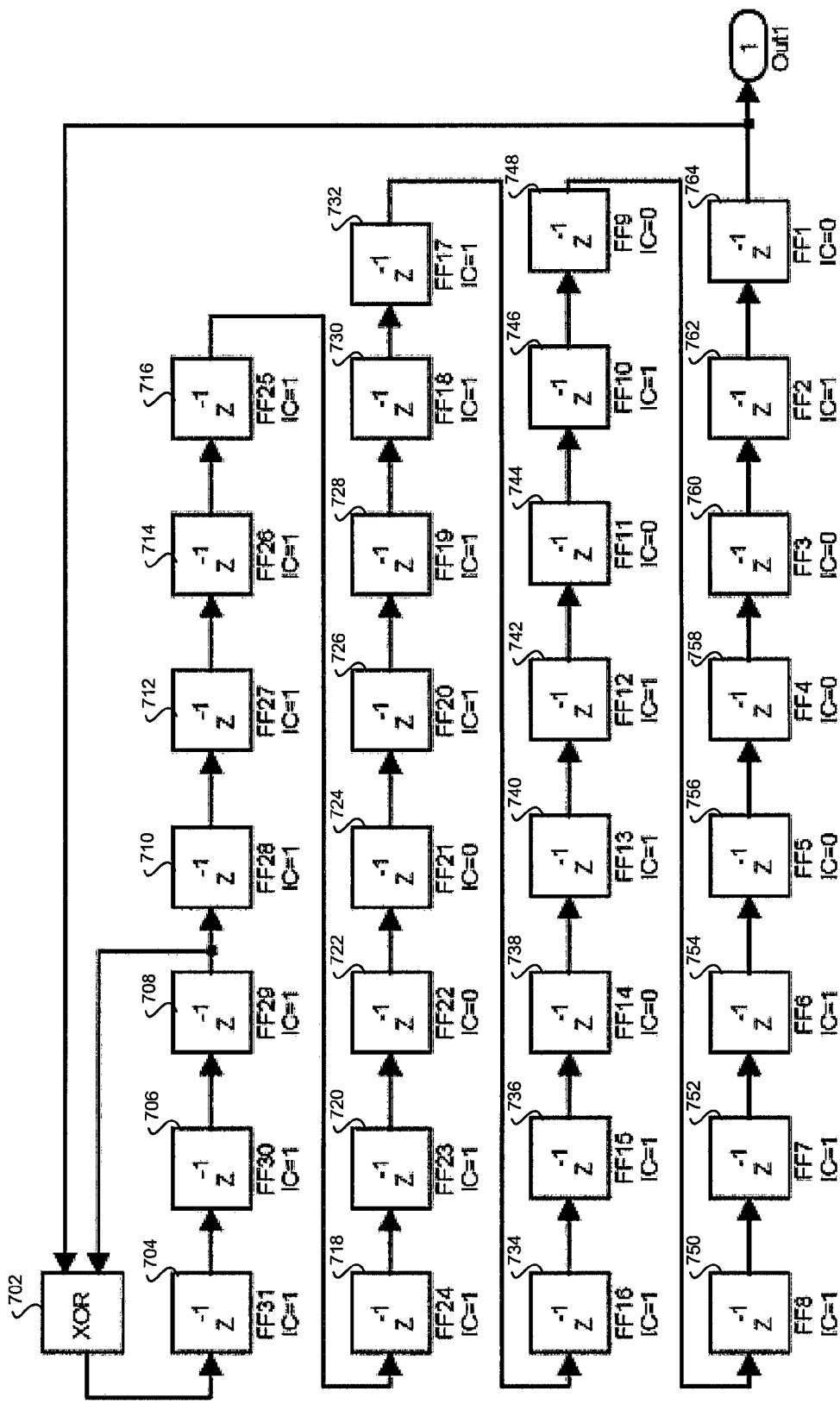
FIG. 7 is a diagram of an exemplary system for pseudo random bit sequence generation, in accordance with an embodiment of the invention.

FIG. 7 is a diagram of an exemplary system for pseudo random bit sequence generation, in accordance with an embodiment of the invention. The system for pseudo random bit sequence generation, as illustrated in FIG. 7, may be substantially as described for the pseudo random bit sequence generator 202 (FIG. 2). Referring to FIG. 7, there is shown a logical XOR block 702, and a plurality of time delay blocks 704, 706, 708, 710, 712, 714, 716, 718, 720, 722, 724, 726, 728, 730, 732, 734, 736, 738, 740, 742, 744, 746, 748, 750, 752, 754, 756, 758, 760, 762, and 764. The logical XOR block 702 may be substantially as described for the logical XOR block 502 (FIG. 5). The plurality of timing delay blocks 704, 706, . . . , 764 may each be substantially as described for the timing delay block 312 (FIG. 3).

At the start of operation, each of the timing delay blocks 704, 706, . . . , 764 may comprise a corresponding initial bit value. Collectively among the plurality of timing delay blocks, the corresponding plurality of initial bit values may represent a seed number. The logical XOR block 702 may receive an input from the output of the timing delay block 708, and an input from the output of the timing delay block 764. The output from the logical XOR block 702 may be coupled to an input of the timing delay block 704.

The output from the timing delay block 704 may be coupled to an input of the timing delay block 706. The output from the timing delay block 706 may be coupled to an input of the timing delay block 708. The output from the timing delay block 708 may be coupled to an input of the timing delay block 710. The output from the timing delay block 710 may be coupled to an input of the timing delay block 712. The output from the timing delay block 712 may be coupled to an input of the timing delay block 714. The output from the timing delay block 714 may be coupled to an input of the timing delay block 716. The output from the timing delay block 716 may be coupled to an input of the timing delay block 718. The output from the timing delay block 718 may be coupled to an input of the timing delay block 720.

The output from the timing delay block 720 may be coupled to an input of the timing delay block 722. The output from the timing delay block 722 may be coupled to an input of the timing delay block 724. The output from the timing delay block 724 may be coupled to an input of the timing delay block 726. The output from the timing delay block 726 may be coupled to an input of the timing delay block 728. The output from the timing delay block 728 may be coupled to an input of the timing delay block 730. The output from the timing delay block 730 may be coupled to an input of the timing delay block 732. The output from the timing delay block 732 may be coupled to an input of the timing delay block 734. The output from the timing delay block 734 may be coupled to an input of the timing delay block 736. The output from the timing delay block 736 may be coupled to an input of the timing delay block 738. The output from the timing delay block 738 may be coupled to an input of the timing delay block 740.

The output from the timing delay block 740 may be coupled to an input of the timing delay block 742. The output from the timing delay block 742 may be coupled to an input of the timing delay block 744. The output from the timing delay block 744 may be coupled to an input of the timing delay block 746. The output from the timing delay block 746 may be coupled to an input of the timing delay block 748. The output from the timing delay block 748 may be coupled to an input of the timing delay block 750. The output from the timing delay block 750 may be coupled to an input of the timing delay block 752. The output from the timing delay block 752 may be coupled to an input of the timing delay block 754. The output from the timing delay block 754 may be coupled to an input of the timing delay block 756. The output from the timing delay block 756 may be coupled to an input of the timing delay block 758. The output from the timing delay block 758 may be coupled to an input of the timing delay block 760. The output from the timing delay block 760 may be coupled to an input of the timing delay block 762. The output from the timing delay block 762 may be coupled to an input of the timing delay block 764. The output from the timing delay block 764 may correspond to the output from the pseudo random bit sequence generator 202.

Figure 8:
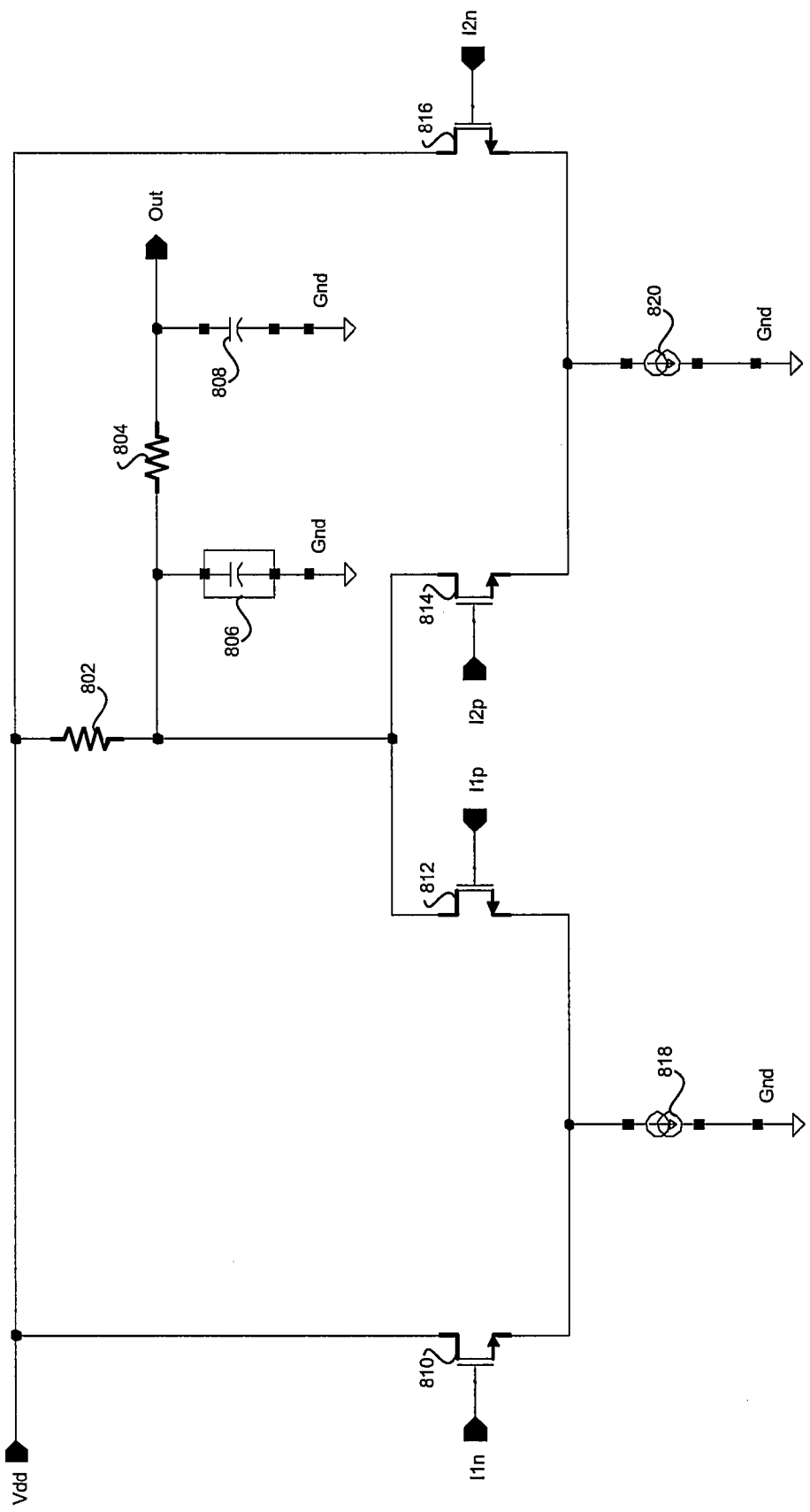
FIG. 8 is a diagram of an exemplary circuit for digital to analog conversion, in accordance with an embodiment of the invention.

FIG. 8 is a diagram of an exemplary circuit for digital to analog conversion, in accordance with an embodiment of the invention. The system for digital to analog conversion, as illustrated in FIG. 8, may be substantially as described for the DAC block 210 (FIG. 2). Referring to FIG. 8, there is shown a plurality of resistors 802, and 804, a plurality of capacitors 806, and 808, a plurality of transistors 810, 812, 814, and 816, and a plurality of current sources 818 and 820. The transistors 810, 812, 814, and 816 may utilized any among a plurality of technologies, for example various metal oxide silicon (MOS) technologies such as complementary MOS (CMOS), n-channel MOS (NMOS), p-channel MOS (PMOS), or junction field effect transistor (JFET), or bipolar technologies, for example.

The resistors 802 and 804, and capacitors 806 and 808 may form low pass filter circuitry, which is integrated within a single integrated circuit device. The low pass filter circuitry may be utilized to filter an analog signal generated by the DAC block 210. The filtered analog signal, as measured at the signal point labeled Out in FIG. 8, may correspond to an output from the DAC block 210. The filtered analog signal may comprise a magnitude component output from the Cartesian to polar conversion block 158. The magnitude component may be utilized to control a gain of the power amplifier 152. The cutoff frequency $f_{HIGH}$ for the low pass filter may be determined based on the capacitive values for the capacitors 806 and 808, and on values of the resistors 802 and 804.

The inputs I1p and I1n may correspond to a differentially encoded signal corresponding to the Bit1_In input to the DAC block 210. The input I1p may represent a positive polarity bit in the differentially encoded signal corresponding to the Bit1_In input. The input I1n may represent a negative polarity bit in the differentially encoded signal corresponding to the Bit1_In input. The inputs I2p and I2n may correspond to differentially encoded values corresponding to the Bit2_In input to the DAC block 210. The input I2p may represent a positive polarity bit in the differentially encoded signal corresponding to the Bit2_In input. The input I2n may represent a negative polarity bit in the differentially encoded signal corresponding to the Bit2_In input. The Bit1_In input to the DAC block 210 may correspond to the Bit1_Out output from the dynamic element matching block 208. The Bit2_In input to the DAC block 210 may correspond to the Bit2_Out output from the dynamic element matching block 208.

The Bit2_In input may correspond to bit 2 in a bit tuple {bit 2, bit 1} generated by the dynamic element matching block 208. The Bit1_In input may correspond to bit 1 in the bit tuple. The positive polarity bit I2p may correspond to the bit 2 equal to a logic HIGH value. The positive polarity bit I2p may equal a HIGH signal level when bit 2 equals a binary HIGH value, for example. The negative polarity bit I2n may correspond to the bit 2 equal to a logic LOW value. The negative polarity bit I2n may equal a HIGH signal level when bit 2 equals a logic LOW value, for example. The positive polarity bit I1p may correspond to the bit 1 equal to a logic HIGH value. The positive polarity bit I1p may equal a HIGH signal level when bit 1 equals a logic HIGH value, for example. The negative polarity bit I1n may correspond to the bit 1 equal to a logic LOW value. The negative polarity bit I1n may equal a HIGH signal level when bit 1 equals a binary LOW value, for example.

Based on signal levels for the input I1n, the transistor 810 may be enabled to enter an activated conducting state. In the activated conducting state, the transistor 810 may enable a current conduction path between the supply voltage source, labeled Vdd, and ground, labeled Gnd, via the current source 818. When the input I1n enables the transistor 810 to enter an active conducting state, the signal level for the input I1p may enable the transistor 812 to enter a deactivated nonconducting state. In the deactivated nonconducting state the transistor 812 may disable a current conduction path between the supply voltage source and ground, via the current source 818.

Similarly, based on signal levels for the input I2n, the transistor 816 may be enabled to enter an activated conducting state. In the activated conducting state, the transistor 816 may enable a current conduction path between the supply voltage source, and ground, via the current source 820. When the input I2n enables the transistor 816 to enter an active conducting state, the signal level for the input I2p may enable the transistor 814 to enter a deactivated nonconducting state. In the deactivated nonconducting state the transistor 814 may disable a current conduction path between the supply voltage source and ground, via the current source 820.

When inputs I1n and I2n enable the corresponding transistors 810 and 816 to enter activated conducting states, a current flow may be approximately equal to 0 through the resistors 802 and 804, for example. The corresponding voltage measured at the Out signal label may correspond to a level 0 signal level, in an exemplary embodiment of the invention. When inputs I1p and I2p enable the corresponding transistors 812 and 814 to enter activated conducting states, an increased level of current flow may be enabled through the resistors 802 and 804 in comparison to the condition in which the transistors 812 and 814 are in deactivated nonconducting states. The corresponding voltage measured at the Out signal label may correspond to the level 2 signal level, in an exemplary embodiment of the invention. The filter circuitry may limit a rate of change in the voltage level as measured at the Out signal label based on the cutoff frequency $f_{HIGH}$.

When input I1p enables the transistor 812 to enter an activated conducting state, while the input I2p enables the transistor 814 to enter an deactivated nonconducting state, the corresponding voltage as measured at the Out signal label may correspond to a level 1 signal level, in an exemplary embodiment of the invention. This voltage may be referred to as a {0, 1} voltage level. When input I2p enables the transistor 814 to enter an activated conducting state, while the input I1p enables the transistor 812 to enter an deactivated nonconducting state, the corresponding voltage as measured at the Out signal label may correspond to a level 1 signal level, in an exemplary embodiment of the invention. This voltage may be referred to as a {1, 0} voltage level. The {0, 1} voltage level may not be equal to the {1, 0} voltage level. The voltage difference may comprise mismatch noise.

Figure 9:
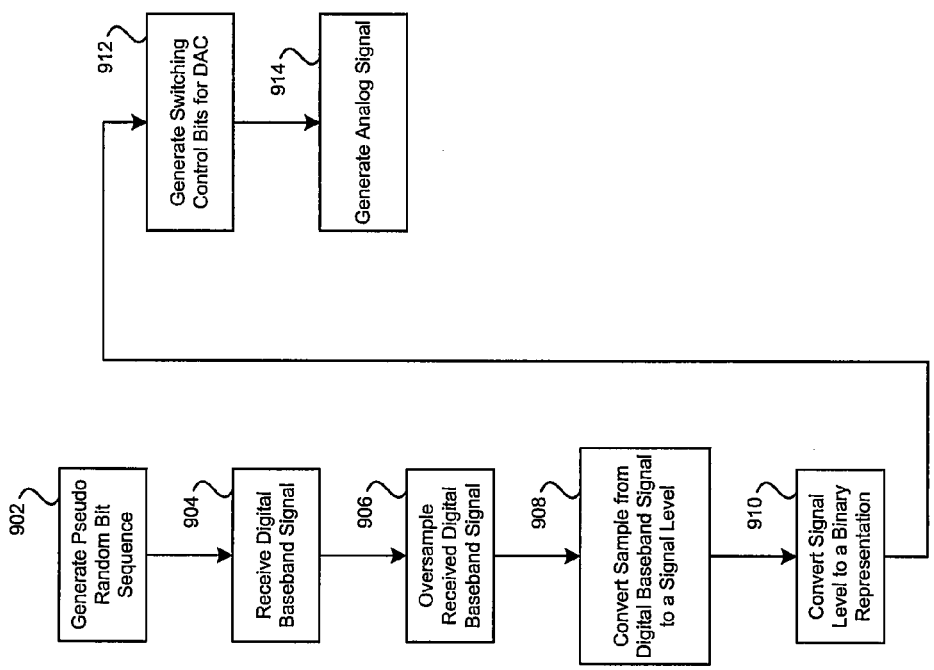
FIG. 9 is a flowchart illustrating exemplary steps for digital to analog conversion for power amplifier driver amplitude modulation, in accordance with an embodiment of the invention.

FIG. 9 is a flowchart illustrating exemplary steps for digital to analog conversion for power amplifier driver amplitude modulation, in accordance with an embodiment of the invention. Referring to FIG. 9, in step 902 a pseudo random bit sequence may be generated by the pseudo random bit sequence generator 202. In step 904, the delta sigma modulation quantizer 204 may receive a digital baseband signal. In step 906, the delta sigma modulation quantizer 204 may oversample the received digital baseband signal and generate an output signal. In step 908, the delta sigma modulation quantizer 204 may convert a sample from the digital baseband signal to a signal level. In step 910, the binary encoder 206 may convert the signal level to a binary representation. In step 912, the dynamic element matching block 208 may generate switching control bits for the DAC 210 based on the signal level. In step 914, the DAC 210 may generate an analog signal based on the switching control bits.

Aspects of a system for digital to analog conversion for power amplifier driver amplitude modulation may comprise a Cartesian to polar converter 158 that enables oversampling, within a single integrated circuit device 200, of each of a plurality of samples in a digital baseband signal. A delta sigma modulation quantizer 204 may enable reduction of a number of bits in each of the oversampled plurality of samples so as to cause displacement of quantization noise that occurred as a result of the oversampling. A subsequent signal may be generated based on the oversampling. A digital to analog converter (DAC) 210 may enable the subsequent signal to be low-pass filtered utilizing filter circuitry in the single integrated circuit device 200. Each of the plurality of samples within the digital baseband signal may comprise an M-bit binary data word, that is converted to at least one of a plurality of K signal levels, where K and M represent numbers, wherein the value of K may be less than $2^M$.

The DAC 210 may enable generation of the subsequent signal comprising a current one of the plurality of K signal levels, followed by a zero signal level, followed by a subsequent one of the plurality of K signal levels. A binary encoder 206 may enable conversion of each of the plurality of K signal levels to a corresponding N bit binary word, wherein N may represent a number. A lowest value or highest value for the N bit binary data word may correspond to a highest or lowest value for one of the plurality of K signal levels. The value for the N bit binary data word that may be greater than a lowest value, and less than a highest value, for the N bit binary data word may correspond to one of the plurality of K signal levels that may be greater than a lowest level, and less than a highest level for the one of the plurality of K signal levels. A dynamic element matching block 208 may enable generation of switching control bits based on the N bit binary data word and on bits generated based on a pseudo random bit sequence. The switching control bits may be differentially encoded.

The DAC 210 may enable selection of one of the plurality of K signal levels based on positive polarity bits in the differentially encoded switching control bits. The DAC 210 may enable generation of a zero signal level based on values for negative polarity bits in the differentially encoded switching control bits. The DAC 210 may enable generation of the subsequent signal comprising one of the plurality of K signal levels based on current values for positive polarity bits, followed by a zero signal level based on values for negative polarity bits, followed by a subsequent one of the plurality of K signal levels based on subsequent values for the positive polarity bits. The current values for the positive polarity bits may be binary complements to corresponding subsequent values for the positive polarity bits based on the pseudo random bit sequence.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for amplitude modulation in a wireless communication system, the method comprising:
    oversampling, within a single integrated circuit device, each of a plurality of samples in a baseband signal;
    reducing a number of bits in each of said oversampled plurality of samples so as to cause, based on a generated pseudo random bit sequence, displacement of quantization noise that occurred as a result of said oversampling; and
    low-pass filtering within said single integrated circuit device, a subsequent signal comprising said reduced number of bits.

2. The method according to claim 1, wherein each of said plurality of samples in said baseband signal comprises an M-bit binary data word, that is converted to at least one of a plurality of K signal levels where K and M represent numbers, wherein said value of K is less than $2^M$.

3. The method according to claim 2, comprising generating said subsequent signal comprising a current one of said plurality of K signal levels, followed by a zero signal level, followed by a subsequent one of said plurality of K signal levels.

4. The method according to claim 3, comprising converting each of said at least one of said plurality of K signal levels to a corresponding N-bit binary data word, wherein N represents a number.

5. The method according to claim 4, wherein one of: a lowest and a highest, value for said N-bit binary data word corresponds to one of: a highest and a lowest, value for one of said plurality of K signal levels.

6. The method according to claim 4, wherein a value for said N-bit binary data word that is greater than a lowest value and less than a highest value for said N-bit binary data word corresponds to a value for one of said plurality of K signal levels that is greater than a lowest level and less than a highest level for said one of said plurality of K signal levels.

7. The method according to claim 4, comprising generating switching control bits based on said N-bit binary data word and bits generated based on said generated pseudo random bit sequence.

8. The method according to claim 7, wherein said switching control bits are differentially encoded.

9. The method according to claim 8, comprising selecting one of said plurality of K signal levels based on values for positive polarity bits in said differentially encoded switching control bits.

10. The method according to claim 8, comprising generating a zero signal level based on values for negative polarity bits in said differentially encoded switching control bits.

11. The method according to claim 8, comprising generating said subsequent signal comprising one of said plurality of K signal levels based on current values for positive polarity bits in said differentially encoded switching control bits, followed by a zero signal level based on values for negative polarity bits in said differentially encoded switching control bits, followed by a subsequent one of said plurality of K signal levels based on subsequent values for said positive polarity bits in said differentially encoded switching control bits.

12. The method according to claim 11, wherein said current values for said positive polarity bits are binary complements to corresponding subsequent values for said positive polarity bits based on said generated pseudo random bit sequence.

13. A system for amplitude modulation in a wireless communication system, the method comprising:
   one or more circuits within a single integrated circuit device that enable oversampling of each of a plurality of samples in a baseband signal;
   said one or more circuits enable reduction of a number of bits in each of said oversampled plurality of samples so as to cause, based on a generated pseudo random bit sequence, displacement of quantization noise that occurred as a result of said oversampling; and
   said one or more circuits enable low-pass filtering of a subsequent signal comprising said reduced number of bits.

14. The system according to claim 13, wherein each of said plurality of samples in said baseband signal comprises an M-bit binary data word, that is converted to at least one of a plurality of K signal levels where K and M represent numbers, wherein said value of K is less than $2^M$.

15. The system according to claim 14, wherein said one or more circuits enable generation of said subsequent signal comprising a current one of said plurality of K signal levels, followed by a zero signal level, followed by a subsequent one of said plurality of K signal levels.

16. The system according to claim 15, wherein said one or more circuits enable conversion of each of said at least one of said plurality of K signal levels to a corresponding N-bit binary data word, wherein N represents a number.

17. The system according to claim 16, wherein one of: a lowest and a highest, value for said N-bit binary data word corresponds to one of: a highest and a lowest, value for one of said plurality of K signal levels.

18. The system according to claim 16, wherein a value for said N-bit binary data word that is greater than a lowest value and less than a highest value for said N-bit binary data word corresponds to a value for one of said plurality of K signal levels that is greater than a lowest level and less than a highest level for said one of said plurality of K signal levels.

19. The system according to claim 16, wherein said one or more circuits enable generation of switching control bits based on said N-bit binary data word and bits generated based on said generated pseudo random bit sequence.

20. The system according to claim 19, wherein said switching control bits are differentially encoded.

21. The system according to claim 20, wherein said one or more circuits enable selection of one of said plurality of K signal levels based on values for positive polarity bits in said differentially encoded switching control bits.

22. The system according to claim 20, wherein said one or more circuits enable generation of a zero signal level based on values for negative polarity bits in said differentially encoded switching control bits.

23. The system according to claim 20, wherein said one or more circuits enable generation of said subsequent signal comprising one of said plurality of K signal levels based on current values for positive polarity bits in said differentially encoded switching control bits, followed by a zero signal level based on values for negative polarity bits in said differentially encoded switching control bits, followed by a subsequent one of said plurality of K signal levels based on subsequent values for said positive polarity bits in said differentially encoded switching control bits.

24. The system according to claim 23, wherein said current values for said positive polarity bits are binary complements to corresponding subsequent values for said positive polarity bits based on said generated pseudo random bit sequence.

* * * * *